United States Patent [19]
Porter

[11] Patent Number: 5,297,087
[45] Date of Patent: Mar. 22, 1994

[54] METHODS AND DEVICES FOR ACCELERATING FAILURE OF MARGINALLY DEFECTIVE DIELECTRIC LAYERS

[75] Inventor: Stephen R. Porter, Boise, Id.

[73] Assignee: Micron Semiconductor, Inc., Boise, Id.

[21] Appl. No.: 54,902

[22] Filed: Apr. 29, 1993

[51] Int. Cl.$^5$ .............................................. G11C 7/00
[52] U.S. Cl. ..................................... 365/201; 365/149
[58] Field of Search ............... 365/201, 149; 371/10.1, 371/21.1

[56] References Cited

U.S. PATENT DOCUMENTS

| | | | |
|---|---|---|---|
| 4,751,679 | 6/1988 | Dehganpour | 365/201 |
| 5,155,701 | 10/1992 | Komori et al. | 365/201 |
| 5,243,569 | 9/1993 | Atsumi | 365/201 |
| 5,255,229 | 10/1993 | Tanaka et al. | 365/201 |

Primary Examiner—Eugene R. LaRoche
Assistant Examiner—Tan Nguyen
Attorney, Agent, or Firm—Wells, St. John, Roberts, Gregory & Matkin

[57] ABSTRACT

A semiconductor memory device includes a plurality of row lines, a plurality of column lines, and a common storage cell plate. The memory device also includes a cell plate generator which produces a reference voltage. The reference voltage is connected to the common storage cell plate. A row decoder connects a row line voltage to selected individual row lines. A stress mode detection circuit receives a row line stress voltage and generates a stress mode signal in response. The row decoder is responsive to the stress mode signal to simultaneously bias all of the row lines to the row line stress voltage. At least one equilibrate circuit is also connected to receive the stress mode signal and is responsive to the stress mode signal to bias the column lines to the reference voltage. The memory device is furthermore responsive to the stress mode signal to ground the reference voltage. The circuits described create a voltage stress differential between the column lines, the row lines, and the common storage cell plate. This voltage stress differential is greater than any voltage differential occurring between the row lines, the column lines, and the storage cell plate during normal memory access operations. The voltage stress differential is maintained for a relatively long period to induce failure of marginally defective dielectric layers within the semiconductor memory device.

26 Claims, 3 Drawing Sheets

METHODS AND DEVICES FOR ACCELERATING FAILURE OF MARGINALLY DEFECTIVE DIELECTRIC LAYERS

TECHNICAL FIELD

This invention relates to method for stressing semiconductor devices to induce dielectric failure of marginally defective dielectric layers within the semiconductor devices.

BACKGROUND OF THE INVENTION

Memory chips such as dynamic random access memories are fabricated in arrays on semiconductor wafers. After fabrication, some of the chips are inoperable. Functional or operational testing is required to determine which of the chips are inoperable. This testing often utilizes wafer test pads to which external testing circuits are connected.

Many faults within semiconductor chips do not reveal themselves immediately after fabrication. For example, excessively thin layers or areas of insulating oxide may initially provide sufficient insulation to prevent current leakage between adjacent conducting layers. However, these thin layers or areas, with time, will gradually break down, resulting in current leakage between adjacent conducting layers of the semiconductor chip. It is only after this dielectric breakdown that conventional electronic operational testing will detect chip defects.

The phenomenon described above is referred to as "time-dependent dielectric breakdown." The physical structure which results in time-dependent dielectric breakdown varies. For instance, this type of chip defect could be caused simply by an insufficient deposition of insulating oxide. More frequently, a defect is caused by a contaminating particle or impurity within the insulating oxide at a critical location between conductors. Such a particle or impurity has the effect of reducing the insulator thickness over a very small but critical area.

Time-dependent dielectric breakdown is a serious problem since it often takes hours, days, or even years for a defect of this type to manifest itself. Accordingly, functional electronic testing, even if repeated numerous times, is often incapable of detecting this type of defect.

Time-dependent dielectric breakdown is aggravated or accelerated by voltage, time, and temperature. Since time is a constant, semiconductor manufactures sometimes raise testing voltages or temperatures in an attempt to accelerate the effects of marginally defective dielectrics. One common testing method, known as "burning in" a semiconductor chip, involves repeated functional testing at elevated temperatures. The most significant disadvantage associated with this type of testing is the lengthy periods which are required, even at elevated temperatures, to induce actual chip failure in marginally defective chips. A forty-eight hour burn-in cycle is typical. At the high production rates of modern semiconductor manufacturers, burn-in procedures are a significant expense.

Another disadvantage of conventional burn-in procedures is that they can typically be performed only after individual chips are separated from their wafers and packaged. Once packaged, a chip's built-in redundancy features cannot be used to salvage defective circuits within the chip. Furthermore, it is preferable to identify unusable and unsalvageable chips prior to packaging to avoid the expense of packaging.

Accordingly, methods have been developed to induce early breakdown of weak dielectric layers prior to chip packaging. One such method is described in U.S. Pat. No. 4,751,679 to Dehganpour. Dehganpour contemplates testing memory cell gate oxides by imposing an elevated voltage on all of a memory array's row lines simultaneously. Such an elevated voltage aggravates gate oxide defects, in some cases causing their breakdown to the point that defects can be detected in subsequent functional testing.

However, Dehganpour is concerned primarily with testing the gate oxide of memory cell transfer devices. The current state of the art does not adequately address the need for accelerating dielectric failures in other areas of semiconductors and semiconductor memories, such as between column lines, row lines, and storage cell plates. These conductive elements typically intersect each other at numerous points across a memory array, being insulated from each other at their intersections by thin dielectric layers. Marginal defects in dielectric layers at the intersections can eventually result in chip failures.

The invention described below provides a simple and efficient method and circuit for accelerating failure of marginally-defective dielectric layers. The circuits and processes allow defects to be detected at the wafer stage of chip fabrication so that built-in redundancies can be utilized to improve wafer yield, and so that unsalvageable chips can be discarded before packaging. The methods described below also reduce the time required for burn-in testing, resulting in greatly increased testing efficiencies.

BRIEF DESCRIPTION OF THE DRAWINGS

Preferred embodiments of the invention are described below with reference to the accompanying drawings.

DETAILED DESCRIPTION OF THE PREFERRED EMBODIMENTS

Figure 1:
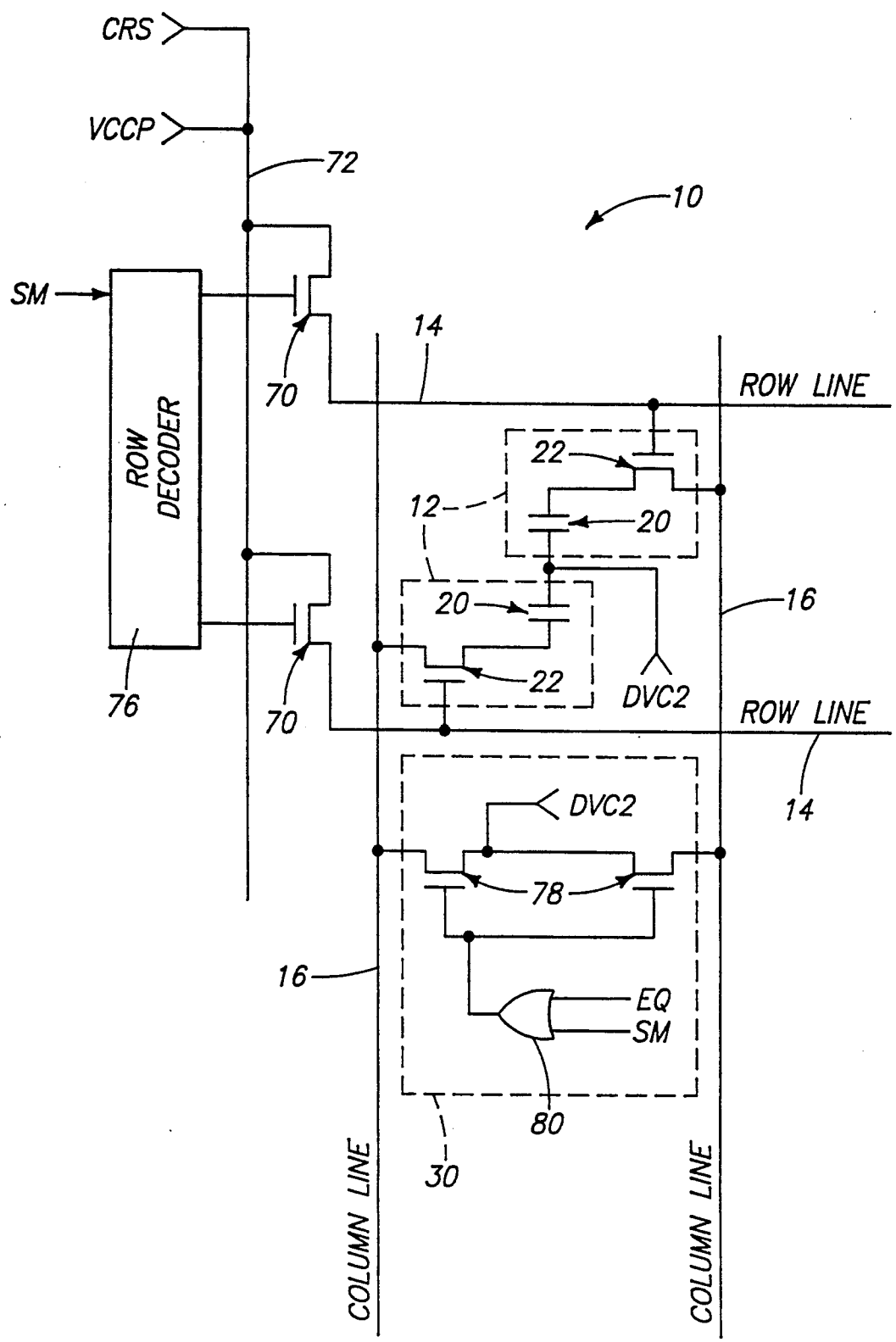
FIG. 1 is a schematic representation of a portion of a dynamic random access memory in accordance with a preferred embodiment of the invention.

This disclosure of the invention is submitted in furtherance of the constitutional purposes of the U.S. Patent Laws "to promote the progress of science and useful arts." U.S. Constitution, Article 1, Section 8.

The preferred methods of the invention are described below with reference to a preferred physical embodiment of the invention. The preferred physical embodiment is a semiconductor memory device comprising:

a plurality of row lines;

a plurality of column lines;

a common storage cell plate;

a cell plate generator which produces a reference voltage, the reference voltage being connected to the common storage cell plate;

a row line voltage source which produces a row line voltage;

a test pad to receive an externally-supplied stress voltage, the stress voltage being received by the row line voltage source to increase the magnitude of the row line voltage beyond that which occurs during memory access operations;

a stress mode detection circuit which receives the stress voltage and generates a stress mode signal in response;

a row decoder which selectively biases individual row lines to the row line voltage during memory access operations, the row decoder being responsive to the stress mode signal to simultaneously bias all of the row lines to the increased-magnitude row line voltage; and at least one equilibrate circuit connected to receive the reference voltage from the cell plate generator and being responsive to the stress mode signal to simultaneously bias a plurality of the column lines to the reference voltage.

The invention includes methods of stressing a semiconductor devices such as the one described above to induce dielectric failure of marginally defective dielectric layers within the semiconductor devices.

The methods include:

simultaneously connecting a row line stress voltage to a plurality of row lines; a column line stress voltage to a plurality of column lines; and a cell plate stress voltage to the common storage cell plate; and creating a voltage stress differential between at least two of the stress voltages, the voltage stress differential being greater than any voltage differential occurring between the row lines, the column lines, and the storage cell plate during memory access operations.

This and other aspects of the invention are described in more detail with reference to FIGS. 1-4. The discussion below includes various methods for testing semiconductor memory devices, suitable for dynamic random access memories (DRAMs), static random access memories (SRAMs), and other memory devices derived from DRAMs and SRAMs such as video RAMs and cache memory products. The testing methods of this invention can also be applied to one-time programmable memories such as ROMs, PROMs, and EPROMs, and also to many-time programmable devices, such as EEPROMs and flash memory.

Some of the testing methods described herein can also be used to evaluate non-memory semiconductor devices, such as microprocessors, gate arrays, and programmable logic arrays. While this invention is suitable for various types of semiconductor devices, explanation of the present invention will be made with reference to a memory device, and more particularly, to a DRAM device as illustrated in FIG. 1.

FIG. 1 shows relevant elements of a semiconductor dynamic random access memory device or circuit (DRAM), generally designated by the reference numeral 10. DRAM 10 includes a plurality of memory cells or units 12, a plurality of row or word lines 14, and a plurality of column or bit lines 16.

The memory units are arranged in memory array columns which each include numerous memory unit pairs such as the one pair shown. Each column might contain, for example, 1024 or 2048 pairs of memory units. Each memory unit 12 comprises a storage capacitor or cell 20 and an access switch or device 22 which is preferably an n-channel metal oxide semiconductor field effect transistor.

A first side or plate of storage cell 20 is connected to a suitable reference voltage. This reference voltage is typically equal to $V_{cc}/2$, or half the voltage of the memory device power supply. It is produced by a circuit typically referred to as a cell plate generator (discussed below), and is referred to as DVC2. The first plates of all storage cells 20 are typically formed by a single conducting layer within memory device 10, so that they are at a common electrical potential equal to DVC2.

A second side or plate of storage cell 20 is connected to one active terminal of access device 22. One of column lines 16 is connected to the other active terminal of access device 22. The gate of access device 22 is connected to one of row lines 14. Each memory unit 12 is therefore connected to both a row line 14 and a column line 16.

The row lines and column lines form a two-dimensional matrix having a plurality of intersections. A single memory unit 12 corresponds to each intersection between a row line and a column line. At a single such intersection, a row line is connected to selectively activate the corresponding memory unit. Activating the memory unit connects the memory unit's storage capacitor to the corresponding column line to allow conventional memory access operations such as reading, writing, or refreshing.

Memory device 10 utilizes what is commonly referred to as a "folded" column line configuration, wherein each pair of column lines is associated with only a single positive sense amplifier (not shown), a single negative sense amplifier (not shown), and a single column line equilibrate circuit 30.

Each row line 14 is selectively activated by a row driver switch or transistor 70. Each row driver transistor 70 has one active terminal connected to a row line 14, and another active terminal connected to a common row line voltage signal or source 72. Row line voltage source 72 typically supplies an elevated row line activation voltage slightly higher than $V_{cc}$ during memory access cycles. Such an elevated voltage is produced within memory device 10 by conventional capacitive pumping. A row decoder circuit 76 is connected to the gate of each row driver transistor 70 to selectively bias or connect individual row lines to the elevated row line voltage in response to a supplied address signal (not shown) during memory access operations. In addition, row decoder circuit 76 receives stress mode signal SM and is responsive to stress mode signal SM to simultaneously connect the row line voltage to a plurality of row lines.

Memory device 10 also includes a plurality of equilibrate circuits 30, corresponding to the folded column line pairs. Each equilibrate circuit 30 includes a pair of equilibrate transistors 78. One terminal of each equilibrate transistor is connected to receive the cell plate reference voltage DVC2. The other terminal of each equilibrate transistor is connected to one of the adjacent column lines 16. Equilibrate circuits 30 are responsive to an equilibrate signal EQ and to a stress mode signal SM to simultaneously connect reference voltage DVC2 to each of the column lines. During normal memory access operations, equilibrate signal EQ is activated to "pre-charge" the column lines to an intermediate voltage (DVC2) prior to activating transfer devices 22. During stress mode testing, stress mode signal SM is activated to apply steady state reference voltage DVC2 to all of the column lines simultaneously. Specifically, the equilibrate signal EQ and the stress mode signal SM are connected through an OR-type logic circuit or gate 80 to the gates of equilibrate transistors 78. Equilibrate circuit 30 is thus responsive to either EQ or SM to bias column lines 16 to DVC2.

Figure 2:
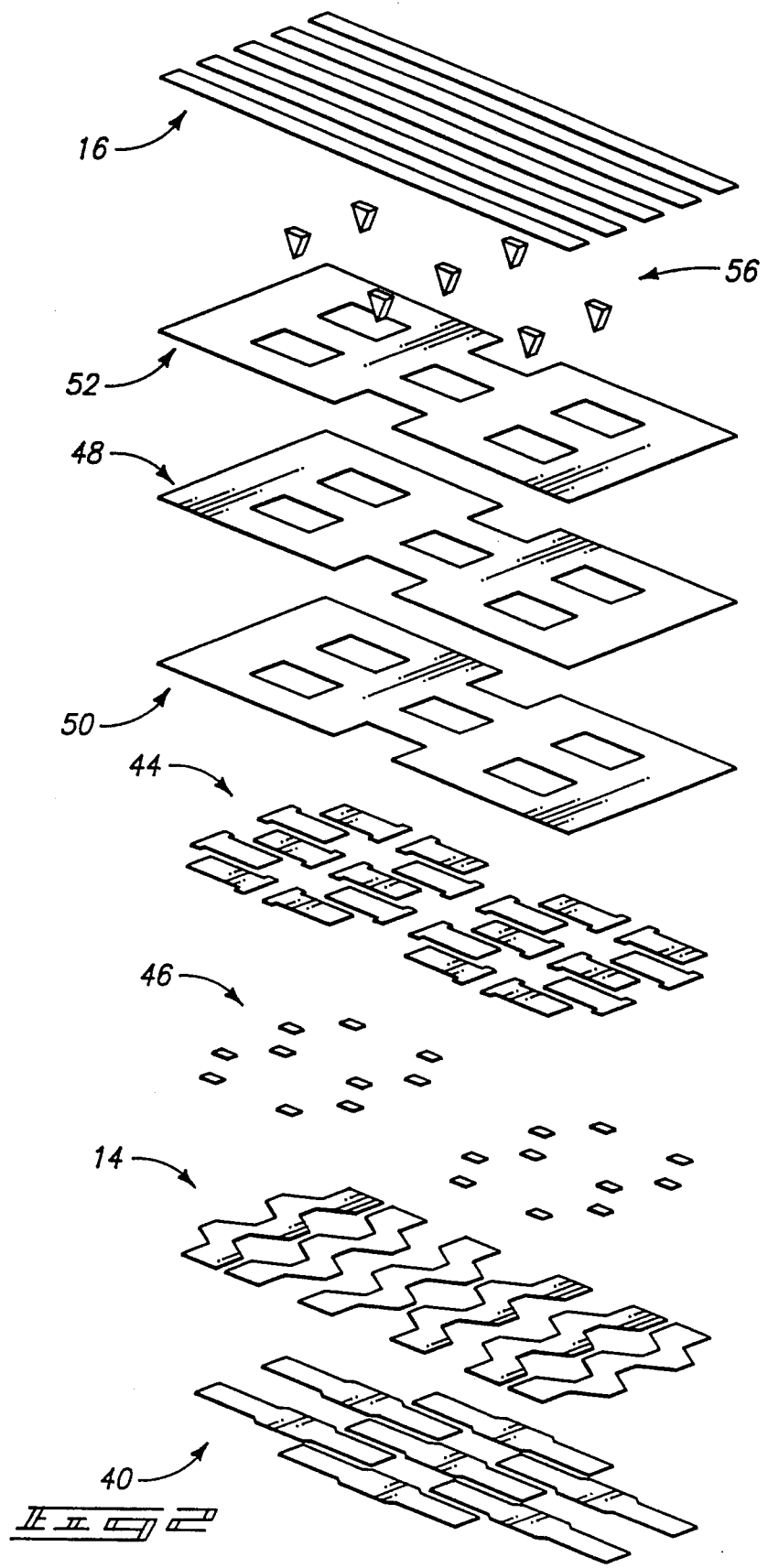
FIG. 2 is a simplified exploded view of a portion of the dynamic random access memory device shown in FIG. 1.

FIG. 2 illustrates the pertinent physical construction of a typical dynamic random access memory. Transfer device active areas 40 are formed in underlying polysilicon. A plurality of row lines 14 extend parallel to each other across active areas 40, forming gate areas between pairs of active areas 40. A gate oxide layer (not shown) insulates the row lines 14 from the underlying polysilicon. Individual cell or capacitor storage nodes 44 are positioned relative to each underlying memory unit transistor to form the individual second plates of storage capacitors 20. Storage nodes 44 are conductively connected to appropriate underlying active areas 40 by buried contacts 46. A common storage cell plate 48 overlies the storage nodes 44, being insulated from the storage nodes by a first dielectric layer 50. Common storage cell plate 48 forms the first plate of each storage cell 20. A second dielectric layer 52 overlies the common storage cell plate 48. Conductive metal column lines 16 extend parallel to each other and perpendicular to the direction of row lines 14 across second dielectric layer 52. Metal contacts 56 extend downward through the various layers to connect column lines 16 to the appropriate active areas 40 of the underlying transistors.

FIG. 2 is somewhat simplified in that all layers are shown as being planar. Actually, many of the layers described above have irregular contours. Also, there are points within the semiconductor structure at which first dielectric layer 50 does not come between the row lines and the column lines. Accordingly, a weak or marginally defective dielectric layer could result in leakage between a column line and a row line, between a row line and the common cell plate, between the common cell plate and one of the column lines, or between a row line and a cell storage node. The methods of this invention allow stressing the memory device to induce or accelerate the breakdown and failure of such marginally defective dielectric layers.

As described above, each storage capacitor 20 has its first plate formed by common storage cell plate 48. This plate is connected or biased by a cell plate generator to reference voltage DVC2. DVC2 is also supplied to equilibrate circuit 30 for selective connection to column lines 16 during normal memory access operations and also during the stress mode testing described below.

The methods of this invention allow stress voltages to be placed between the row lines, the column lines, the common storage cell plate, and the storage nodes, and to be maintained for relatively lengthy periods. These stress voltages induce or accelerate break-down of marginally defective dielectric layers within the semiconductor memory device so that failures at the intersection of row lines, column lines, and the storage cell plate can be detected at the wafer fabrication stage without extended burn-in testing. More specifically, the methods of the invention include simultaneously connecting a row line stress voltage to a plurality of row lines 14, a column line stress voltage to a plurality of column lines 16, and a cell plate stress voltage to the common storage cell plate 48. The methods further include creating a voltage stress differential between at least two of these stress voltages. The voltage stress differential is greater than any voltage differential occurring between the row lines, the column lines, and the storage cell plate during normal memory access operations. The voltage stress differential is preferably created between any one of the stress voltages and the other two of the stress voltages.

As an example, a normal voltage differential for conventional DRAM circuits would be about 5 volts. Accordingly, the methods of this invention would include creating a voltage stress differential of between 6 and 9 volts between the row lines and column lines, between the column lines and the common storage cell plate, or between the common storage cell plate and the row lines. In a DRAM circuit, it is preferable to simultaneously connect the column lines and the common storage cell plate to a single common stress voltage. This common stress voltage forms both the column line stress voltage and the cell plate stress voltage. It is advantageously created by grounding the column lines and the common storage cell plate. The voltage stress differential is created by controlling the row line stress voltage in relation to the common stress voltage.

The voltage stress differential preferably at least 20% greater than any voltage differential occurring between the row lines, column lines, and storage cell plate during normal memory access operations. This voltage stress differential is maintained for a relatively long duration in comparison to normal memory access cycles, such as a minimum of 10 seconds, and in many cases longer than 30 seconds.

In the preferred embodiment, the methods described above are accomplished by increasing the magnitude of the row line voltage beyond that which occurs during normal memory access operations; decreasing the magnitude of reference voltage DVC2 beyond that which occurs during memory access operations; and simultaneously connecting the increased-magnitude row line voltage to a plurality of row lines 14 and the decreased-magnitude reference voltage to a plurality of column lines 16.

In this discussion, reference to changes in various voltage magnitudes is intended to indicate change in absolute values, or, where appropriate, changes in the relative values of voltages. It is recognized that increasing a given voltage in one circuit would be equivalent to and have the same effect as decreasing a voltage in another circuit. For instance, the memory circuits described herein are implemented primarily with n-channel field effect transistors. The circuits could also be implemented with p-channel transistors, in which case voltage polarities would in most cases be opposite. This discussion and the claims which follow are meant to cover both situations.

Figure 3:
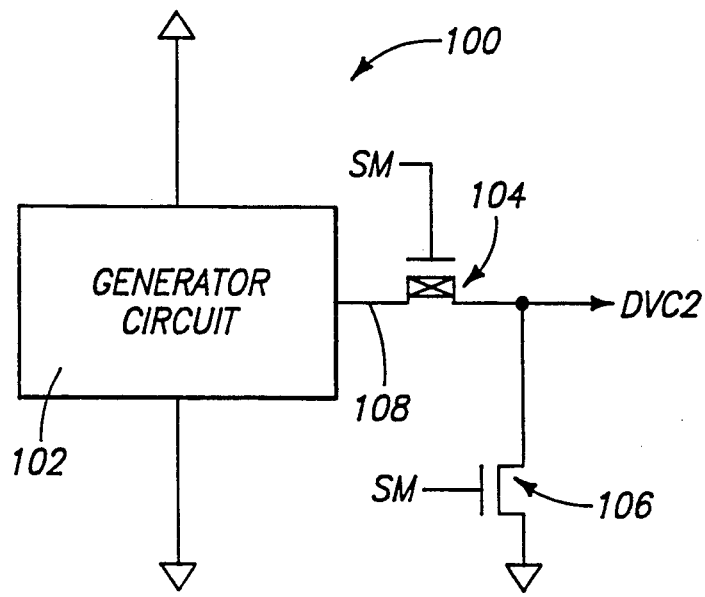
FIG. 3 is a simplified schematic representation of a cell plate generator circuit in accordance with a preferred embodiment of the invention. The circuit of FIG. 3 produces a cell plate voltage DVC2 which is connected as indicated to the circuit of FIG. 1.

The preferred embodiment of the invention includes circuits and means for conveniently performing the methodical steps described above. For example, FIG. 3 shows a cell plate generator or reference voltage source 100. Cell plate generator is connected to ground and $V_{cc}$ to produce reference voltage DVC2. It includes a generator circuit 102, as well as an output cutoff switch or transistor 104 and a grounding switch or transistor 106. Output cutoff transistor 104 and grounding transistor 106 form a stress mode reference reducer circuit which is responsive to stress mode signal SM to decrease the magnitude of reference voltage DVC2.

More specifically, generator circuit 102 has a voltage output 108. Output cutoff transistor 104 has one of its active terminals connected to voltage output 108 and the other of its active terminals connected to produce reference voltage DVC2. The gate of output cutoff transistor 104 is connected to stress mode signal SM. Output cutoff transistor 104 is a p-channel device so that it does not conduct when SM is active.

Grounding transistor 106 has one of its active terminals connected to ground, and the other of its active terminals connected to reference voltage DVC2. Its gate is connected to stress mode signal SM. Grounding transistor 106 is an n-channel device so that it does conduct when SM is active.

Cell plate generator 100 is thus responsive to stress mode signal SM to ground DVC2 while isolating DVC2 from the output of generator circuit 102.

Figure 4:
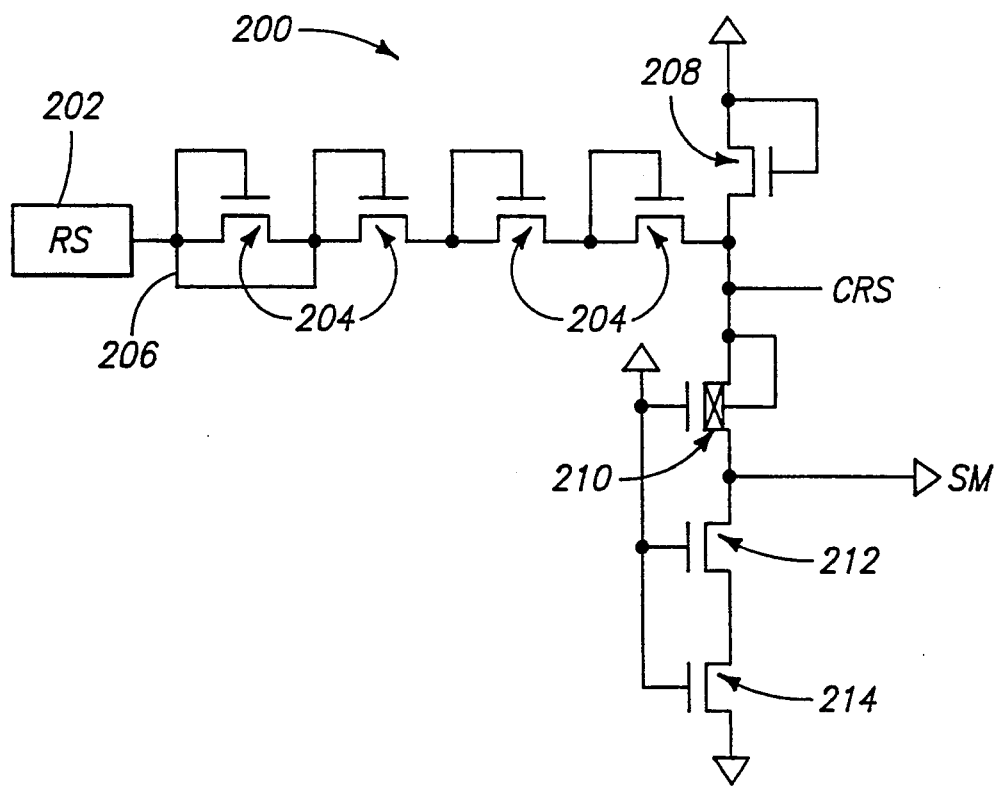
FIG. 4 is a schematic representation of a stress mode detection circuit in accordance with a preferred embodiment of the invention. The circuit of FIG. 4 produces a conditioned row line stress voltage CRS and a stress mode signal SM which are connected as indicated to the circuits of FIGS. 1 and 3.

FIG. 4 shows a stress mode detection circuit 200 within memory device 10 which receives an externally-supplied row line stress voltage RS and which generates stress mode signal SM in response. Stress mode detection circuit 200 also conditions row line stress voltage RS and produces a conditioned row line stress voltage designated as CRS.

Stress mode detection circuit 200 includes a test pad 202 which is suitable for connection to a test probe of an automated wafer tester. Stress mode detection circuit 200 receives a row line stress voltage RS from the automated tester to initiate stress mode testing within memory device 10. The circuit optionally includes a series of diode-connected transistors 204 to reduce the magnitude of the stress voltage RS as desired, resulting in conditioned row line stress voltage CRS. Such voltage reduction might be necessary, for instance, when a particular testing device is incapable of supplying exactly the desired voltage. In such a case, the tester can be configured to supply a higher voltage, which is then reduced through diode-connected transistors 204. Any number of such transistors can be bypassed as required during fabrication by one or more jumpers 206.

A pull-up transistor 208 is connected from $V_{cc}$ to CRS to ensure that diode-connected transistors 204 are reverse biased when the row line stress voltage RS is not being supplied.

Stress mode detection circuit 200 includes a stress voltage detection circuit, comprising a p-channel transistor 210 and a pair of n-channel biasing transistors 212 and 214 connected in series. The source of p-channel transistor 210 is connected to conditioned row line stress voltage CRS. The drain of p-channel transistor 210 is connected to the drain of n-channel biasing resistor 212. The source of n-channel biasing transistor 212 is connected to the drain of n-channel biasing transistor 214. The source of n-channel biasing transistor 214 is connected to ground. The gates of transistors 210, 212, and 214 are connected to $V_{cc}$.

The node formed by the drains of p-channel transistor 210 and n-channel biasing transistor 212 produce the stress mode signal SM. P-channel transistor 210 ensures that SM is not activated until conditioned row line stress voltage CRS exceeds $V_{cc}$ by $V_T$, the threshold voltage of transistor 210. Biasing transistors 212 and 214 are weak pull-down transistors which bias stress mode signal SM low when no stress mode voltage is supplied.

In operation, stress mode testing is initiated by supplying a row line stress voltage RS from an external source through memory device test pad 202. This activates stress mode signal SM, and also supplies conditioned row line stress voltage CRS to row line voltage source 72 to increase the magnitude of the row line voltage beyond that which occurs during memory access operations.

The magnitudes of row line stress voltage RS and of conditioned row line stress voltage CRS are higher than any row line voltage occurring during normal memory access operation, and are preferably at least 20% above such a normally-occurring line voltage. For instance, conditioned row line stress voltage CRS is typically between 6 and 6.5 volts for a 5-volt DRAM circuit, and between 3.6 and 5 volts for a 3-volt DRAM circuit. Row decoder 76 is activated in response to stress mode signal SM to simultaneously bias all of the row lines to the increased-magnitude row line voltage.

Furthermore, cell plate generator 100 is responsive to the activation of stress mode signal SM to automatically ground or decrease the magnitude of reference voltage DVC2. Activating stress mode signal SM also automatically activates equilibrate circuit 30 to simultaneously bias all of the column lines to the decreased-magnitude reference voltage. DRAM circuit 10 is thus responsive to stress mode signal SM to simultaneously connect all of the column lines 16 and the common storage cell plate 48 to a common stress voltage. The common stress voltage has a magnitude which is lower than that normally applied to the storage cell plate during memory operations. Specifically, in the preferred embodiment described, the column lines and the common storage cell plate are grounded.

Supplying a row line stress voltage RS above $V_{cc}$ also increases the magnitude of the row line voltage beyond that which occurs during memory access operations, and automatically biases all row lines 14 to conditioned row line stress voltage CRS. The various voltage changes create a voltage stress differential which is greater than any voltage differential occurring between the row lines and the column lines during normal memory access operations. The conditioned row line stress voltage CRS is preferably supplied for at least 10 seconds, and in some cases longer than 30 seconds.

The stress mode testing described above greatly reduces, and in some cases eliminates, the need for conventional burn-in testing, while also improving the detection rate of marginally defective dielectric areas. In a memory circuit having 1024 columns, the simultaneous application of a stress voltage to all column lines cuts testing time by a factor of over 1000. Furthermore, more defects can be detected at the wafer level, allowing greater utilization of redundancy to corrected chip failures.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of stressing a semiconductor memory device to induce failure of marginally defective dielectric layers within the semiconductor memory device, the memory device having a plurality of row lines, a plurality of column lines, and a common storage cell plate; the method comprising the following steps:

simultaneously connecting a row line stress voltage to a plurality of row lines; a column line stress voltage to a plurality of column lines; and a cell plate stress voltage to the common storage cell plate; and creating a voltage stress differential between at least two of the stress voltages, the voltage stress differential being greater than any voltage differential occurring between the row lines, the column lines, and the storage cell plate during memory access operations.

2. A method as recited in claim 1 and further comprising creating the voltage stress differential between one of the stress voltages and the other two of the stress voltages.

3. A method as recited in claim 1 wherein the voltage stress differential is at least 20% greater than any voltage differential occurring between the row lines, the column lines, and the storage cell plate during memory access operations.

4. A method as recited in claim 1 and further comprising maintaining the stress voltage differential for a minimum of 10 seconds.

5. A method as recited in claim 1 and further comprising maintaining the stress voltage differential for a minimum of 30 seconds.

6. A method as recited in claim 1 and further comprising simultaneously connecting the column lines and the common storage cell plate to a common stress voltage, the common stress voltage forming the column line stress voltage and the cell plate stress voltage.

7. A method as recited in claim 1 and further comprising supplying the row line stress voltage from an external source through a memory device test pad.

8. A method as recited in claim 1 and further comprising:
supplying the row line stress voltage from an external source through a memory device test pad; and
generating a stress mode signal in response to the externally-supplied row line stress voltage.

9. A method as recited in claim 1 and further comprising:
supplying the row line stress voltage from an external source through a memory device test pad, wherein the row line stress voltage has a magnitude greater than any row line voltage occurring during memory access operations; and
generating a stress mode signal in response to the externally-supplied row line stress voltage.

10. A method as recited in claim 9 and further comprising simultaneously connecting the column lines and the common storage cell plate to a common stress voltage in response to the stress mode signal, the common stress voltage forming the column line stress voltage and the cell plate stress voltage.

11. A method as recited in claim 9 and further comprising simultaneously connecting the column lines and the common storage cell plate to a common stress voltage in response to the stress mode signal, the common stress voltage forming the column line stress voltage and the cell plate stress voltage, the common stress voltage having a magnitude which is less than that which is normally applied to the storage cell plate during memory access operations.

12. A method of stressing a semiconductor memory device to induce failure of marginally defective dielectric layers within the semiconductor memory device, the memory device having a plurality of row lines; a plurality of column lines, and a common storage cell plate; the common storage cell plate being connected to a reference voltage; the row lines being selectively connectable to a row line voltage; the column lines being selectively connectable to the reference voltage; the method comprising the following steps:

increasing the magnitude of the row line voltage beyond that which occurs during memory access operations;

decreasing the magnitude of the reference voltage beyond that which occurs during memory access operations; and simultaneously connecting the increased-magnitude row line voltage to a plurality of row lines and the decreased-magnitude reference voltage to a plurality of column lines.

13. A method as recited in claim 12 and further comprising supplying the increased-magnitude row line voltage from an external source through a memory device test pad.

14. A method as recited in claim 12 and further comprising:
supplying the increased-magnitude row line voltage from an external source through a memory device test pad; and
generating a stress mode signal in response to the externally-supplied increased-magnitude row line voltage.

15. A method as recited in claim 12 wherein the increased-magnitude row line voltage and the decreased-magnitude reference voltage create a voltage stress differential therebetween which is greater than any voltage differential occurring between the row lines and the column lines during memory access operations.

16. A method as recited in claim 12 and further comprising simultaneously connecting the increased-magnitude row line voltage to a plurality of row lines and the decreased-magnitude reference voltage to a plurality of column lines for a minimum of 10 seconds.

17. A method as recited in claim 12 and further comprising simultaneously connecting the increased-magnitude row line voltage to a plurality of row lines and the decreased-magnitude reference voltage to a plurality of column lines for a minimum of 30 seconds.

18. A method as recited in claim 12 and further comprising increasing the magnitude of the row line voltage at least 20% beyond that which occurs during memory access operations.

19. A method of stressing a semiconductor memory device to induce failure of marginally defective dielectric layers within the semiconductor memory device; the memory device having a plurality of row lines, a plurality of column lines, and a common storage cell plate; the storage cell plate being connected to a reference voltage; the memory device having at least one equilibrate circuit connected to selectively bias the column lines to the reference voltage; the memory device also including a row line voltage source which provides a row line voltage, and a row line decoder to selectively connect the row line voltage to the row lines during memory access operations; the method comprising the following steps:

supplying a row line stress voltage to the row line voltage source to increase the magnitude of the row line voltage beyond that which occurs during memory access operations;

generating a stress mode signal within the memory device in response to the increased-magnitude row line voltage being supplied;

activating the row line decoder in response to the stress mode signal to simultaneously bias all of the row lines to the increased-magnitude row line voltage;

decreasing the magnitude of the reference voltage in response to the stress mode signal; and activating the equilibrate circuit in response to the stress mode signal to bias a plurality of the column lines to the decreased-magnitude reference voltage.

20. A method as recited in claim 19 and further comprising supplying the row line stress voltage from an external source through a memory device test pad.

21. A method as recited in claim 19 wherein the increased-magnitude row line voltage and the decreased-magnitude reference voltage create a voltage stress differential therebetween which is greater than any voltage differential occurring between the row lines and the column lines during memory access operations.

22. A method as recited in claim 19 and further comprising supplying the row line stress voltage for a minimum of 10 seconds.

23. A method as recited in claim 19 and further comprising supplying the row line stress voltage for a minimum of 30 seconds.

24. A method as recited in claim 19 wherein the row line stress voltage has a magnitude at least 20% beyond that which occurs during memory access operations.

25. A semiconductor memory device comprising:
a plurality of row lines;
a plurality of column lines;
a common storage cell plate;
a cell plate generator which produces a reference voltage, the reference voltage being connected to the common storage cell plate;
a row line voltage source which produces a row line voltage;
a test pad to receive an externally-supplied stress voltage, the stress voltage being received by the row line voltage source to increase the magnitude of the row line voltage beyond that which occurs during memory access operations;
a stress mode detection circuit which receives the stress voltage and generates a stress mode signal in response;
a row decoder which selectively biases individual row lines to the row line voltage during memory access operations, the row decoder being responsive to the stress mode signal to simultaneously bias a plurality of the row lines to the increased-magnitude row line voltage; and
at least one equilibrate circuit connected to receive the reference voltage from the cell plate generator and being responsive to the stress mode signal to simultaneously bias a plurality of the column lines to the reference voltage.

26. A semiconductor memory as recited in claim 25 and further comprising a stress mode reference reducer circuit which is responsive to the stress mode signal to decrease the magnitude of the reference voltage.

* * * * *